(12) United States Patent
Burgess

(10) Patent No.: US 6,693,593 B1
(45) Date of Patent: Feb. 17, 2004

(54) HIGH FREQUENCY CIRCUIT WITH A CONNECTION FOR A PRINTED ANTENNA

(75) Inventor: Paul Burgess, Bochum (DE)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/111,600
(22) PCT Filed: Oct. 20, 2000
(86) PCT No.: PCT/EP00/10361
§ 371 (c)(1),
(2), (4) Date: Sep. 12, 2002
(87) PCT Pub. No.: WO01/31730
PCT Pub. Date: May 3, 2001

(30) Foreign Application Priority Data
Oct. 26, 1999 (DE) .......................... 199 51 371

(51) Int. Cl.⁷ ................................. H01Q 1/38
(52) U.S. Cl. ................. 343/700 MS; 343/702
(58) Field of Search .......... 343/700 MS, 702, 343/850

(56) References Cited

U.S. PATENT DOCUMENTS

| | | | |
|---|---|---|---|
| 5,278,570 A | 1/1994 | Jaramillo et al. ............ 343/702 |
| 5,386,214 A | * 1/1995 | Sugawara ............ 343/700 MS |
| 5,400,039 A | 3/1995 | Araki et al. ................. 343/760 |
| 5,523,768 A | 6/1996 | Hemmie et al. ............ 343/840 |
| 5,903,239 A | 5/1999 | Takahashi et al. .......... 343/700 |

FOREIGN PATENT DOCUMENTS

| | | | |
|---|---|---|---|
| DE | 29903715 | 7/1999 | .......... H01Q/23/00 |
| EP | 0516981 | 5/1992 | .......... H01Q/21/06 |
| EP | 0523272 | 1/1993 | .......... H01Q/23/00 |
| EP | 0563873 | 10/1993 | .......... H01L/23/66 |
| EP | 0764997 | 3/1997 | |
| EP | 0866517 | 9/1998 | ............ H01Q/9/04 |
| EP | 0929115 | 7/1999 | ............ H01Q/1/24 |
| FR | 2625373 | 6/1989 | ............ H01P/3/09 |

* cited by examiner

Primary Examiner—Hoang V. Nguyen
(74) Attorney, Agent, or Firm—Antonelli, Terry, Stout & Kraus, LLP

(57) ABSTRACT

An HF-circuit RF-C and a printed antenna $A_M$ together form a radio interface for short-range communication. The HF-circuit is designed, in the form of a separate, compact module with its own module antenna $A_M$. The components of the HF-circuit and the module antenna, which is designed as a conductor path surface, are located on a common module circuit board M-PCB. The module circuit board has contacts $C_3$, $C_{FL}$ to connect the HF-circuit to a host device. The feed line of the module antenna and the antenna port AP of the HF-circuit are separate from each other on the module circuit board M-PCB, and each is connected using separate contacts $C_3$, $C_{FL}$. The module is placed on a host circuit board $H\text{-}PCB_1$. The host circuit board $H\text{-}PCB_1$ has a conducting bridge near contacts $C_3$ and $C_{FL}$ that connects the two contacts to each other when the module is placed on the board.

7 Claims, 3 Drawing Sheets

HIGH FREQUENCY CIRCUIT WITH A CONNECTION FOR A PRINTED ANTENNA

Figure 1:
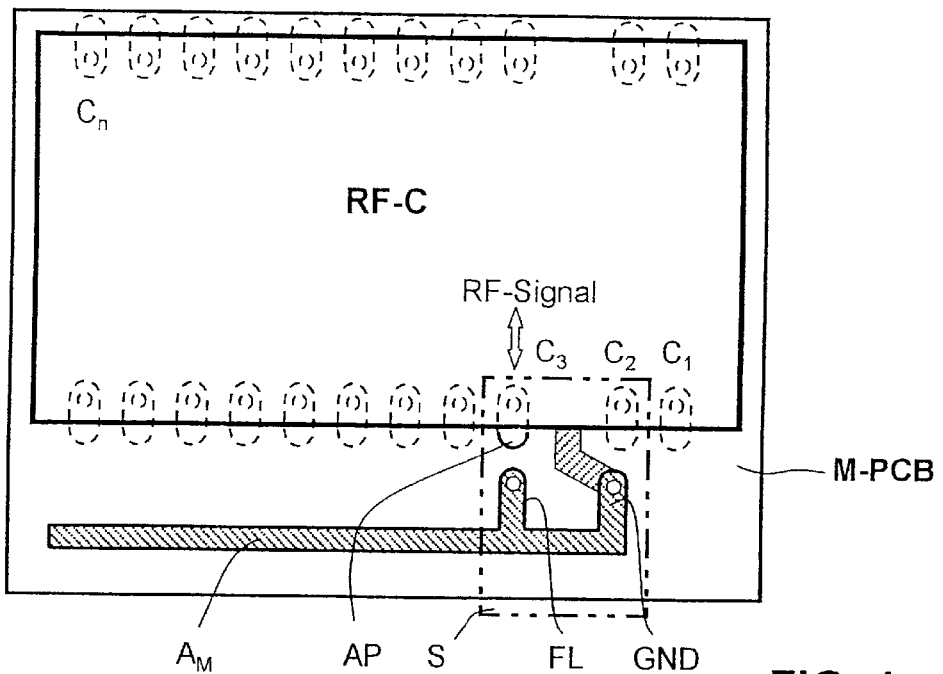

The invention specifies a high frequency circuit with a connection for a printed antenna that together form a radio interface for short-range communication for an electronic device such as a computer, its accessories, a mobile phone or another communication or information technology terminal device.

The HF-circuit can be a sender, a receiver for one-way communication or a sender/receiver, also called a "HF-transceiver", for bi-directional communication at a low transmission power. As a radio interface, it connects the electronic device, called "host device" in the following, with other telecommunication or information technology devices for data communication in a very spatially limited wireless radio network. For short-range communication, for example, point-to-point or point-to-multipoint connections are used in the unlicensed ISM band at transmission frequencies of approximately 2.45 GHz and at transmission powers of a few milliwatts. Such short-range communication technology is also known as >>Bluetooth<< technology. However, the invention can also be used for high frequency circuits that realize radio connections using other technologies such as the well-known European DECT standard used for cordless telephone connections that operates at a frequency of approximately 1900 MHz, for example.

The HF-circuits mentioned are designed as universally applicable modules and are intended to replace the conventional, uncomfortable and troublesome cable connections used to transmit data between mobile devices and their device stations. For this reason an especially inexpensive production as a mass-market product in large quantities is desirable. This is achieved by connecting an inexpensive send/receive antenna as directly as possible to the HF-circuit without complex connectors and shielded antenna wires, amongst other means.

A directly connected surface or patch antenna has proven to be especially favorable for the extremely high frequency ranges and low transmission powers mentioned. This type of antenna is designed as an asymmetric microstrip conductor, also known as an inverted F-antenna. The technical fundamentals of the antenna are described in publication EP 0 757 407, amongst others. An elongated strip conductor a few centimeters long together with two single-sided connecting strips placed close to each other form a tuned antenna that is located next to the electromagnetic shielding of the HF-circuit within a distance of a few millimeters. One connecting strip leads to the feed point of the antenna and the other to the ground point of the antenna so that the F-antenna is inductively coupled. Both connecting strips are directly connected to their corresponding connectors on the HF-circuit. One advantage of the F-antenna is that this type of antenna can be placed on a circuit board inside the housing of a cordless telephone, for example, which protects and hides it, saves space, is inexpensive to manufacture and is still yields good transmission rates.

With the current technological capabilities, the high transmission frequencies and the low transmission power, mass production of extremely compact HF-circuits designs with surface areas of a few square centimeters, including the F-antenna, are possible and are particularly economically advantageous. The economic advantage is increased in that during manufacturing, several similarly designed HF-circuits are manufactured and tested in parallel. As the feed line of every F-antenna is connected to the antenna port during SMD manufacturing, a problem in supplying and removing a signal arises when measuring and tuning the HF-circuit. The input impedance for an antenna port defined according to the ISO 9001 standard, for example 50Ω, is not feasible and the antenna radiates part of the signal away. A proper tuning of the HF-circuit, for example of the transmitting frequency, transmission power or receiver data, is therefore impossible due to the mismatched antenna load and interaction through radiant coupling.

An antenna design that avoids this disadvantage is known from publication EP 0 764 997 in which the circuit of the transceiver is placed together with the antenna on a circuit board of a cordless telephone. The antenna ground point is directly connected to the HF-transceiver, but the feed line to the antenna is interrupted, however. To bridge the interruption there is a contact plate made of springy metal soldered onto the conductor paths of the F-antenna. The F-antenna has a contact reed that points away from the surface of the circuit board. The contact reed lies over the interruption and forms the open connecting bridge of a pressure switch.

There are also contact surfaces on the populated side of the circuit board near the contact plate. A signal sensor is placed on these contact surfaces when measuring and tuning the circuit. When the circuit board is installed in a telephone housing after measuring and tuning the circuit, a pressure element formed on the housing especially for this purpose automatically closes the pressure switch and thereby connects the feed line from the F-antenna to the antenna port.

From the description it is obvious that the pressure switch and the contact surfaces require unwanted extra complexity during automated manufacturing, which then increases the manufacturing costs. In addition, the pressure switch and contact surfaces on and over the circuit board require a relatively large amount of space, and the circuit board must be placed in the housing so that access to the switching bridge exists from inside the housing. This works against the goal of a compressed mechanical design with a minimal board area, and the physical design and layout of the circuit components is limited. Additionally, the contact plate and the additional contact surfaces increase the effective length of the feed line and therefore interfere with the function of the circuit and radiation characteristics of the antenna due to additional inductive and capacitive components. The possibilities when designing the circuit boards are therefore also reduced. The mechanical contact also presents a weak point in terms of reliability that limits the useful life of the host device.

Based on the shortcomings of the known solutions presented, it is the task of the preferred embodiments of the invention to create a HF-circuit with a connection for a printed antenna that avoids the disadvantages described, is extremely compactly built and reduces manufacturing expenses.

The task is solved according to the preferred embodiments of the invention through the design of the HF-circuit in the form of separate, compact module with a separate module antenna. The module constitutes an interface building block for the electronics of any host device in the form of integrated hybrid circuit and can be applied universally in many devices. The module is constructed so that it can simply be placed on the populated side a host circuit board just like other components with a component placement machine. The components of the HF-circuit and the module antenna, which is designed as a printed conductor surface, are placed on a common module circuit board. This has the advantage that the module manufacturer can optimally design and adapt the module antenna, therefore simplifying the design and the construction of the host circuit board for many host devices.

The module circuit board has contacts on it used to connect the HF-circuit to the host device. The feed line of the module antenna and the antenna port of the HF-circuit are located at separate places on the module circuit board and are connected using separate contacts. The module is placed on a host circuit board like an integrated circuit in a automated component placement process after checking and setting the operating values and is connected electrically and mechanically to the board during this process. The host circuit board has a conducting bridge near the contacts for the feed line and antenna port that connects both contacts to each other and implements a reliable electrical HF-connection when placing the module. An advantage of this is that the conductor path to the antenna port is only lengthened by twice the thickness of the module circuit board. This means that the load on the HF-circuit due to additional inductive and capacitive components is lower that of the known solutions. In this case space is not needed on the module circuit board or above it to connect the antenna port and feed line or to access a signal sensor. As mechanical access to the module is not required after placement, the module can be placed anywhere on the host circuit board and the host circuit board can also be placed anywhere in the device. Access to the HF-circuit for the signal sensor is obtained from the back side or from the edge of the module circuit board before the module is placed.

The module circuit board has conductor paths in several layers. The contacts are advantageous conductor surfaces and are located on a conductor side of the board, the contact side of the board or are implemented using metalized surfaces on the edge the module circuit board. The components of the HF-circuit and of the module antenna are located on the other side of the circuit board, the populated side. Connections between the populated side and the contact side are made using well-known plated holes drilled through the circuit board. In the interest of an extremely compact design, the contacts for the feed line and antenna port on the contact side can even be located in an area in which components or shielding for the HF-circuit are located on the populated side.

According to a special design of the invention, the module antenna and the feed line with the corresponding contact are located on a separate section on the edge of the module circuit board. If necessary, a host device manufacturer can also separate this section with the HF-circuit from the main circuit board even after the circuit board has been manufactured. This allows the device manufacturer to equip its host device with a device antenna and to connect it to the antenna port as an alternative to the module antenna. In doing so, the module itself is made smaller, can be placed on the host circuit board at a different location if necessary and can be operated with a separate device antenna that offers improved send/receive specifications. However, as the module manufacturer only manufactures one module type with an integrated antenna for both variants in large quantities, the manufacturing costs are reduced.

Several modules of the same type are manufactured together on a panel of circuit boards in order to reduce the manufacturing costs even further. The manufacturer of the host device then simply decides if the module antenna is to remain on the module or if a device antenna is to be connected using a corresponding separation groove when separating the module from the main circuit board. Once decided, a separation groove is placed in front of or behind the circuit board section at an appropriate location. As the separation groove is required regardless of what the manufacturer decides, no additional time or expense is required.

Figure 2A:
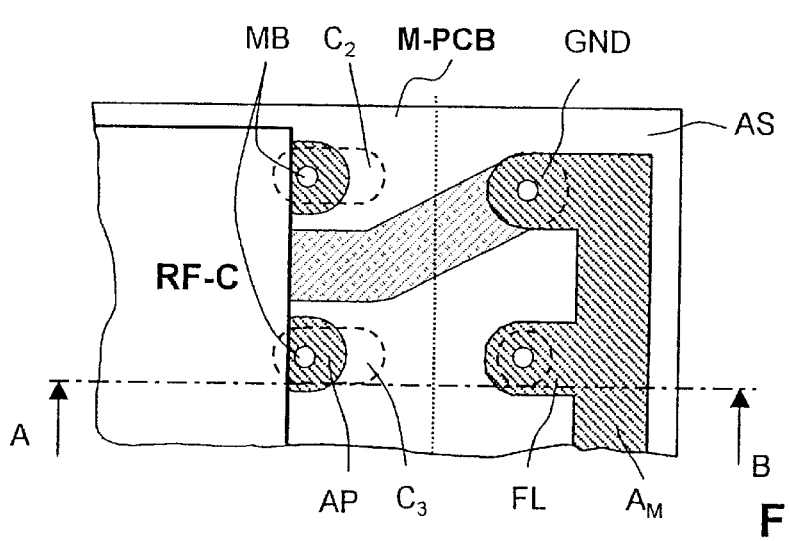
Figure 2B:
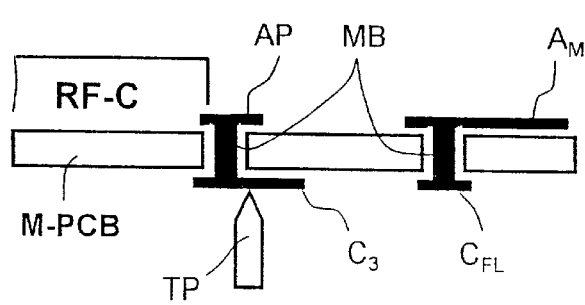
Figure 3A:
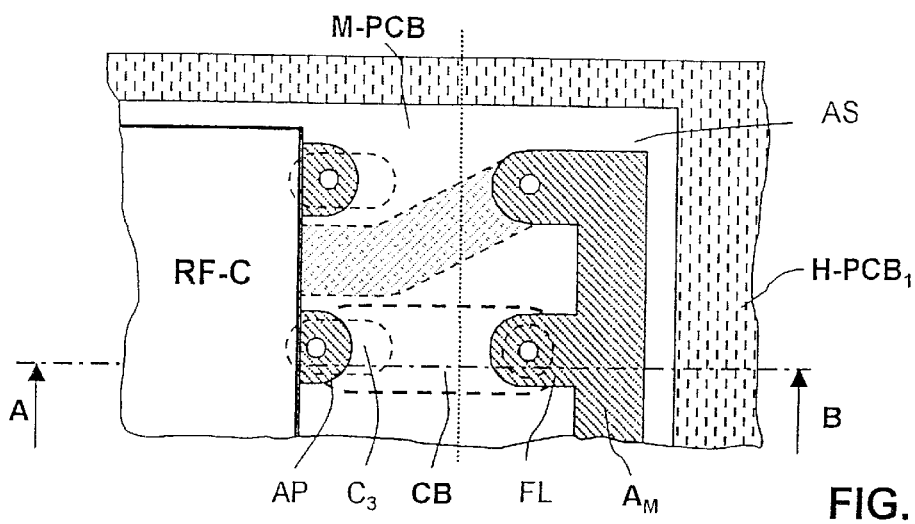
Figure 3B:
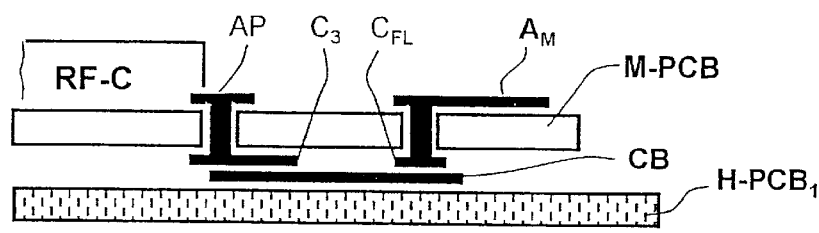
Figure 4A:
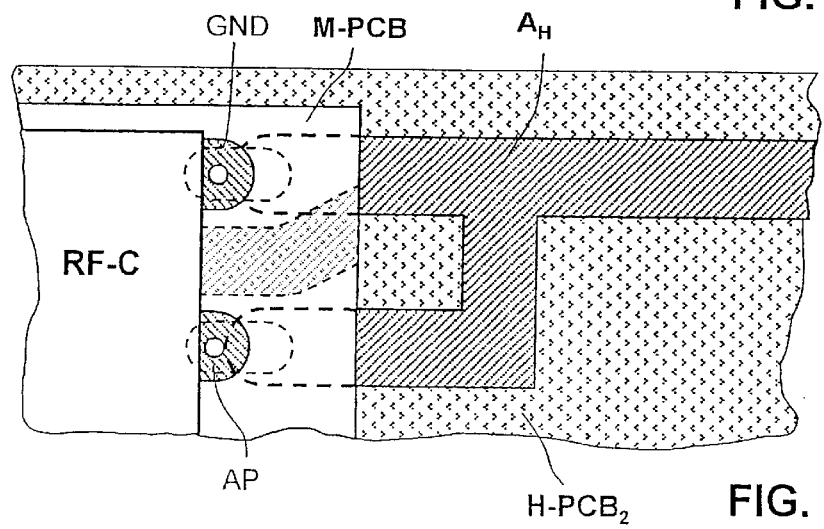
Figure 4B:
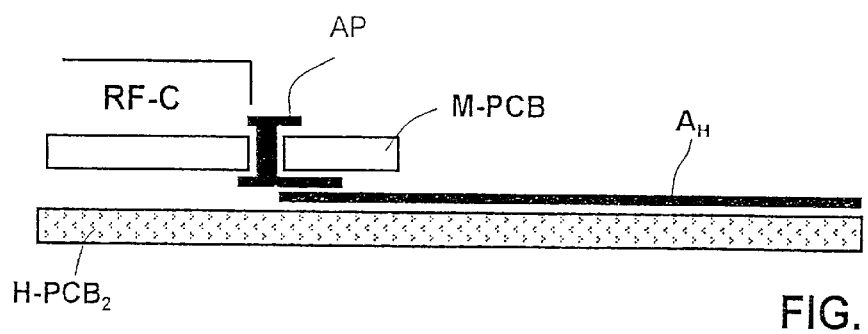
Figure 5:
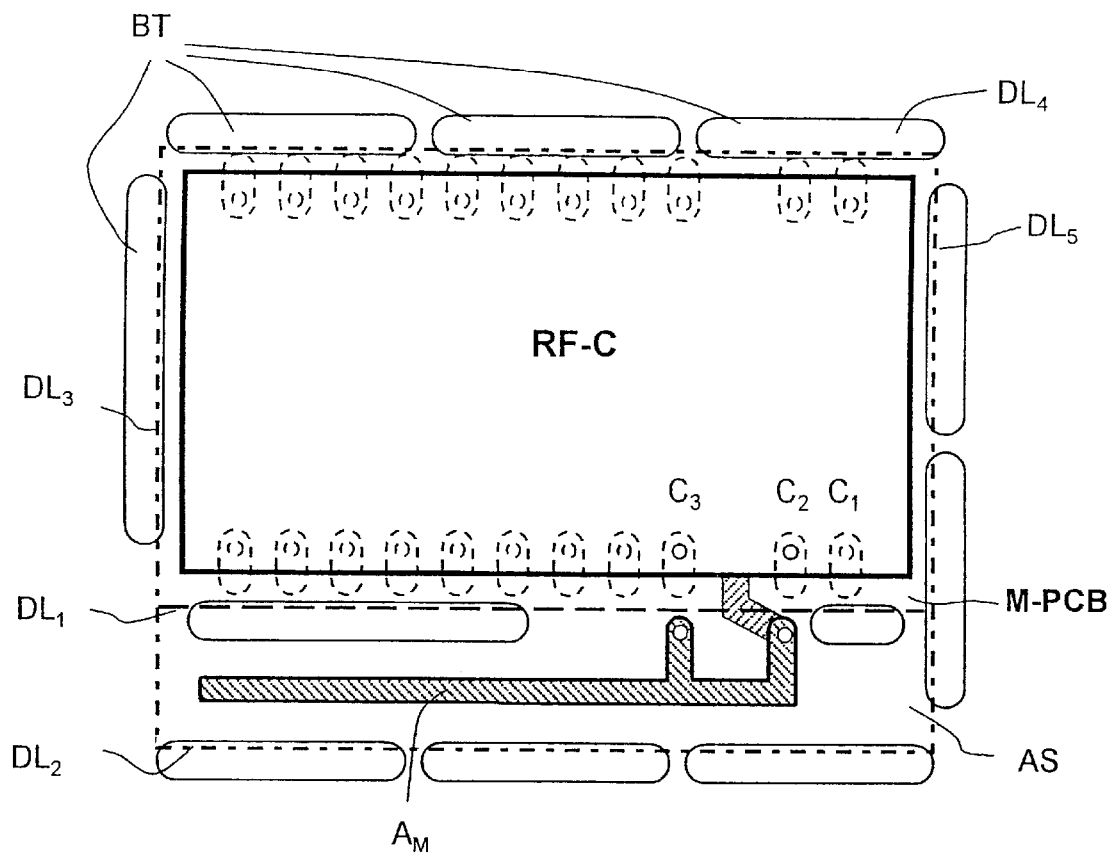

The invention will now be explained in more detail using an example. The corresponding drawings show the following:

FIG. 1 A high frequency module according to the invention with a printed module antenna FIG. 2a A section of the top view of the high frequency module with a module antenna FIG. 2b A section of the side view of the high frequency module according to FIG. 2a FIG. 3a A section of the top view of a host circuit board with an installed high frequency module FIG. 3b A section of the side view of the host circuit board with an installed high frequency module FIG. 4a A section of the top view of a different host circuit board with a device antenna and a high frequency module without a module antenna FIG. 4b A section of the side view of the host circuit board according to FIG. 4a FIG. 5 An overall view of a module according to an embodiment of the invention integrated in to a panel of circuit boards.

FIG. 1 shows a top view of a compact high frequency module according to the invention. It forms a radio interface for the circuit of an electronic host device (not shown), for example of a mobile computer, a mobile telephone or another communication or information technology terminal device. The actual module circuit RF-C is located on a module circuit board M-PCB and is located under a shielded cap. The circuit is preferably mounted on a surface of the module circuit board M-PCB using SMD components (surface mounted device). The details of the module circuit RF-C are not necessary to understand the invention and are therefore not shown. The use of the known F-antenna has proven to be favorable for the operating frequency used of approximately 2 GHz with respect to the technical values and the cost. In accordance with the invention, the F-antenna is placed on the module circuit board M-PCB near the antenna port AP of the module circuit RF-C as module antenna $A_M$ and has a feed line FL as well as a ground point GND.

The module circuit board M-PCB is equipped with conductor path levels in several layers. Contacts $C_1$ through $C_n$, which connect the module circuit RF-C to the signal points in the electronic device or to the power supply, are located on a conductor path level on the outside of the module circuit board M-PCB, referred to in the following as the contact side. To do this, the module is soldered on the surface of a host circuit board H-PCB1 or H-PCB2 like an SMD-component after checking and setting the operating values. Instead of a soldered connection, the high frequency module can also be inserted in a contact socket on the lost circuit board H-PCB1 or H-PCB2.

In the example presented the contact $C_3$ is connected to the antenna port AP of the module circuit RF-C. In the interest of clarity, the figure of the module in FIG. 1 is magnified many times.

FIG. 2a shows a section S from FIG. 1 magnified further that is rotated by 90° C. with respect to the original in order to show more details. The sizes of the conductor paths shown in the figure do not correspond to the scaling factor of the magnification.

In the example presented the antenna port AP ends outside of the shielded cap, is located directly across from the feed line FL and is connected to the contact $C_3$ on the contact side through a metalized hole MB. In contrast to this, the ground point GND of the module antenna AM is connected to a ground connection on an interior layer through its metalized hole MB. The layout of conductor paths is variable, where, as shown in FIG. 1, the holes for contacts $C_1$ through $C_n$ can be located under the shielded cap. A decisive advantage of the invention is that the antenna port AP and the feed line FL of the module antenna are placed near each other and are connected to each other with a minimum of additional capacitance and inductance in the interest of an optimal conductor path layout.

FIG. 2b shows a side view of a cross-section of the section shown in FIG. 2a. The cross-section runs along the lines A–B, where the arrow points in the direction of the line of vision. One metalized hole MB connects the antenna port AP to the contact $C_3$ and another connects the feed line FL to a corresponding contact $C_{FL}$. There are ground contacts for the HF-circuit on the contact side near contact $C_3$, and contact $C_3$ has a sufficiently large surface area to place a signal sender with contact pins TP there and to connect to at least one ground contact during the manufacturing of the module.

The drawings in FIG. 3a and FIG. 3b show corresponding sections of a host circuit board H-PCB, with an installed high frequency module. The host circuit board $H-PCB_1$ has a conducting bridge CB, that, according to the invention, connects the contact surfaces $C_3$ and $C_{FL}$ to each other and therefore connects the feed line FL of the module antenna $A_M$ to the antenna port AP when placed on the module circuit board M-PCB.

For reasons relating to the constructive design or to obtain optimal radiation characteristics of the antenna, it can be advantageous to connect another antenna located in the host device to the high frequency module instead of the module antenna $A_M$. The corresponding solution for this is shown in the drawings in FIG. 4a and FIG. 4b. A host circuit board $H-PCB_2$ contains a host antenna AH in one of its conductor layers instead of the bridge CB. In the example presented this antenna is also a printed antenna that is connected by its feed line via contact $C_3$ to the antenna port AP and via contact $C_2$ to a ground connection of the HF-circuit RF-C after mounting the module on the host circuit board $H-PCB_2$. However, the host antenna AH can also have a different design. In all cases, however, its ground connection GND and the feed line FL are located on the host circuit board $H-PCB_2$ such that the connection to the host antenna AH is created when the high frequency module is soldered onto the board.

To prevent any interference from the module antenna AM, the module antenna is cut off before the module circuit board M-PCB is soldered onto the board. To accomplish this, the module antenna AM is located on an edge of the module in a separate section of the circuit board AS. The module antenna is separated by cutting straight along the dotted line printed on the board or by breaking it off along a breaking line.

FIG. 5 shows a possible design for this solution. For economic reasons several HF-circuits of the same type are manufactured and checked in parallel. The HF-circuits are placed together on a panel of circuit boards and are only separated from each other, for example using a milling machine, just before the components are placed on the host circuit board $H-PCB_2$. To allow for fast separation, there are oval holes drilled in the panel of circuit boards along the separator lines $DL_1$ through $DL_5$ that will form the edges of the modules after separation. In the example presented there is a group of holes along a separator line $DL_1$ that runs between the module circuit RF-C and the module antenna AM, and there is a second group along a separator line $DL_2$ that runs along the other side of the module antenna $A_M$. The separator lines $DL_3$ through $DL_4$ designate the other edges.

The selection of a corresponding separator line determines if the section of the circuit board AS will remain with the module antenna AM on the main circuit board. The section of the circuit board AS is separated on the same edge section used to cut the module off from the panel of circuit boards.

What is claimed is:

1. A RF/antenna-module for a communications apparatus comprising:

an active high frequency circuit with an antenna port and located on a module printed circuit board, and a printed module antenna with a feed line and a ground connector, located together on said module printed circuit board, wherein, the feed line is located adjacent to the antenna port but not connected thereto so that test signals can be applied to the antenna port for alignments or measurements of the high frequency circuit during module production/test;

the module printed circuit board has a plurality of contacts for connection to a host printed circuit board when placing it on the host printed circuit board where the antenna port as well as the feed line are connected using a respective one of the plurality of contacts; and connection between the antenna port and the feed line is established by a conducting bridge on the host printed circuit board when said RF/antenna-module is mounted to said host circuit board.

2. A RF/antenna-module according to claim 1, wherein the printed module antenna is an inverted F-antenna formed of an unsymmetrical microstrip conductor.

3. A RF/antenna-module according to claim 1, wherein electrical connections between the module printed circuit board and the host printed circuit board are solder connections.

4. A RF/antenna-module according to claim 1, wherein electrical connections between the module printed circuit board and the host printed circuit board are established by a socket connector.

5. A RF/antenna-module according to claim 1, wherein the module printed circuit board has a contact surface for temporarily connecting the antenna port via a contact pin with the test/or measurement equipment during module production/test.

6. A RF/antenna-module according to claim 1, wherein the printed module antenna is located on a separate section of the module printed circuit board which section can be easily be separated from the module printed circuit board so that any type of host antenna can be connected to the antenna port instead of the printed module antenna when said RF/antenna-module is mounted to the said host circuit board.

7. A RF/antenna-module according to claim 6, wherein separation of the separate section is made by a straight cut.

* * * * *